United States Patent [19]

Osterwalder

[11] Patent Number: 4,485,474
[45] Date of Patent: Nov. 27, 1984

[54] INJECTION LASER MODULATOR WITH EXTERNAL RESONATOR

[75] Inventor: Johann M. Osterwalder, Encinitas, Calif.

[73] Assignee: General Dynamics/Electronics, San Diego, Calif.

[21] Appl. No.: 329,340

[22] Filed: Dec. 10, 1981

[51] Int. Cl.$^3$ ............................. H01S 3/10; H01S 3/19
[52] U.S. Cl. .......................................... 372/28; 372/44; 372/50; 372/98
[58] Field of Search .................... 372/44, 26, 28, 20, 372/19, 92, 50, 98, 12; 332/7.51

[56] References Cited

U.S. PATENT DOCUMENTS 4,101,845  7/1978  Russer .................................... 372/50

OTHER PUBLICATIONS

Nelson, "A Proposal for Internal Electrooptic Intensity and Frequency Modulation of Diode Lasers", IEEE JQE, Dec. 1967, pp. 667–674.
Edmonds et al., "Spectral Tuning and Mode Control in GaAs Injection Lasers", IBM TDB vol. 12, No. 11, Apr. 1970, p. 1857.
Nilsson et al., "Oscillation Frequency, Line Width Reduction and Frequency Modulation Characteristics for a Diode Laser with External Grating Feedback", Electronics Letters vol. 17, No. 17, Aug. 20, 1981, pp. 589–591.
Osterwalder, J. M. et al.; Frequency Modulation of GaAlAs Injection Lasers at Microwave Frequency Rates; Mar. 1980, IEEE Journal Quantum Elect., vol. QE-16; pp. 250–252.
Osterwalder, J. M. et al.; GaAs MESFET Demodulates Gigabit Signal Rates for GaAlAs Injection Lasers, Proceedings of IEEE, vol. 67, No. 6, Jun. 1979, pp. 966–968.

Primary Examiner—James W. Davie
Attorney, Agent, or Firm—Brown, Martin & Haller

[57] ABSTRACT

An injection laser is provided with a modulator which includes an external resonator cavity including a lithium niobate crystal and a spherical mirror closely coupled to the rear end of the laser with a source of bias voltage for selectively tuning the resonator for high frequency modulating the laser.

17 Claims, 5 Drawing Figures

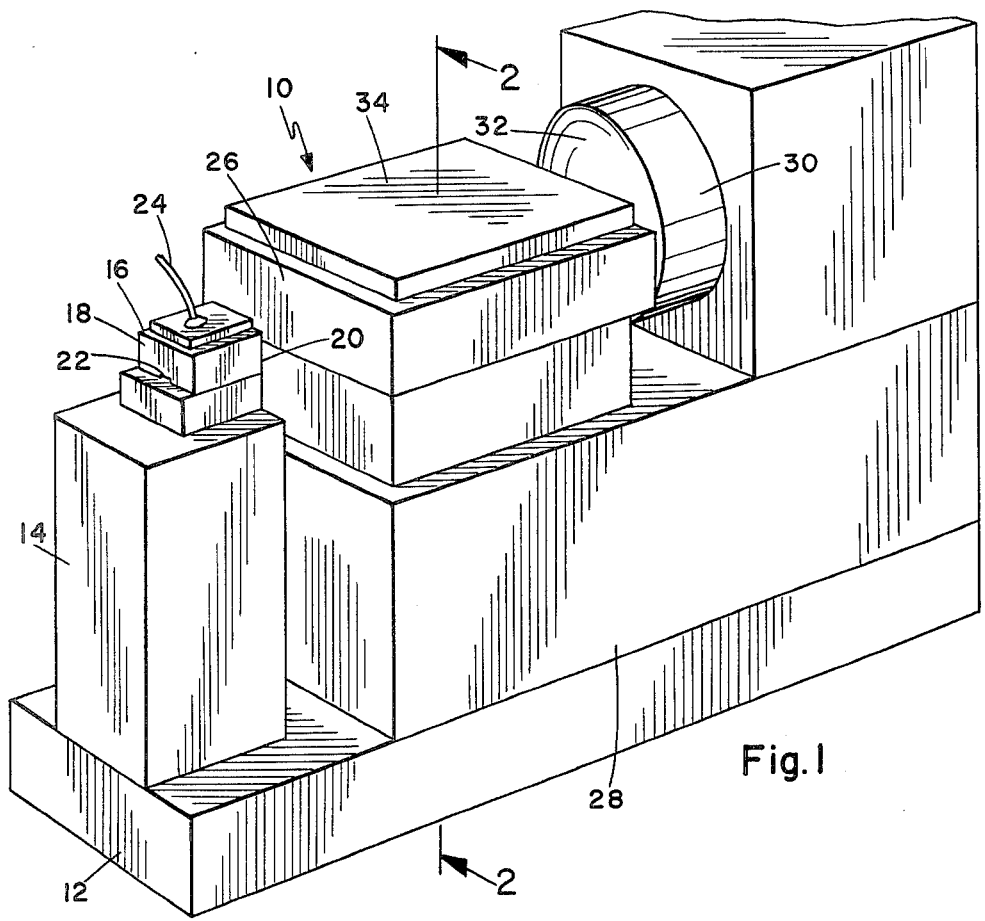
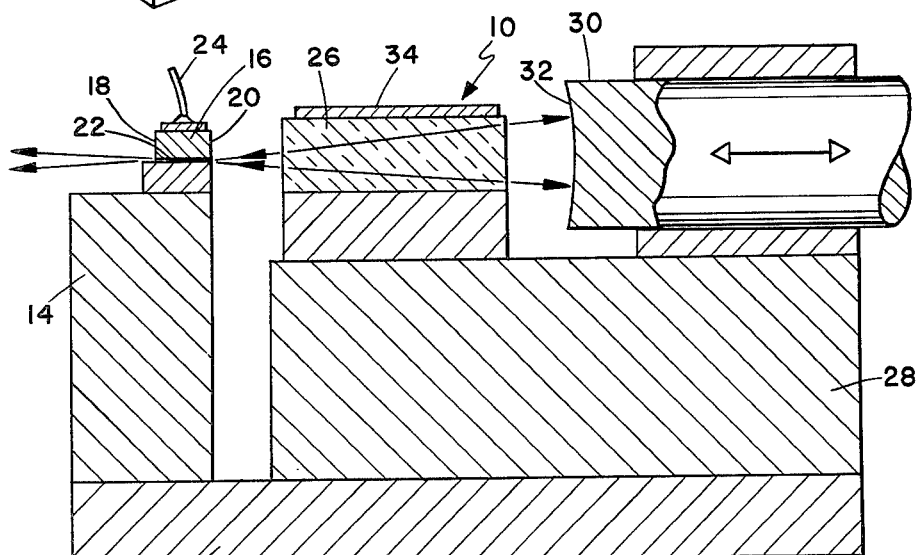

INJECTION LASER MODULATOR WITH EXTERNAL RESONATOR

BACKGROUND OF THE INVENTION

The present invention relates to lasers and pertains particularly to a modulation system for high frequency modulation of lasers.

Many different types of lasers have been developed in recent years. These different types of lasers have many different characteristics and each are suitable for particular special applications. Many of the lasers, because of their peculiar characteristics are more adaptable to certain applications than others.

Certain applications such as communications, require the ability to modulate the laser. The modulation may be either amplitude modulation (AM) or frequency modulation (FM). Frequency modulation of the carrier wave is preferred in communication systems because of its better signal to noise ratio as compared to amplitude modulation.

Injection lasers are one type of laser that is suitable for communication and other similar systems. These lasers are typically modulated by a modulation of the lasers bias current. The problem with this approach, however, is that the modulation rates are typically limited to rates below eight gigahertz. Modulation rates greater than this become difficult because of steady roll off of the achieved modulation depth or modulation index in the case of AM or FM modulation respectively. This type of laser bias modulation is called "internal" modulation.

It is therefore desirable that an improved system of modulation for lasers be available.

SUMMARY AND OBJECT OF THE INVENTION

It is therefore the primary object of the present invention to provide an improved system and method of modulating lasers.

In accordance with the primary aspect of the present invention a laser is provided with a closely coupled external tunable resonator for high frequency modulation of the laser's modes.

DESCRIPTION OF THE DRAWINGS

The above and other objects and advantages of the present invention will become apparent from the following description when read in conjunction with the drawings wherein:

FIG. 1 is a perspective view of the system of the present invention.

FIG. 2 is a sectional view taken along line 2—2.

DETAILED DESCRIPTION OF A PREFERRED EMBODIMENT

Figure 3:
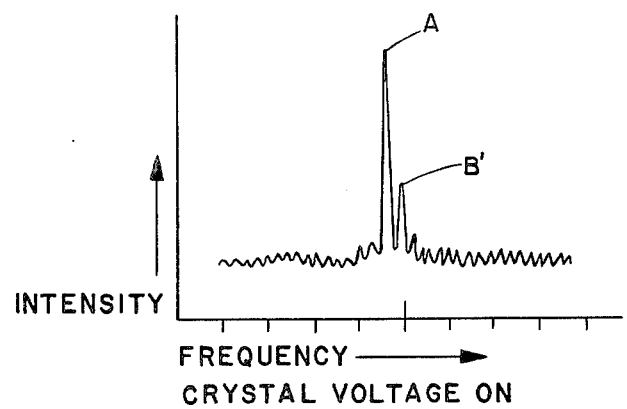
FIG. 3 is a graphic illustration of laser intensity versus frequency at one condition of operation.

Turning to FIG. 1 and 2 of the drawing, there is shown a schematic illustration of a laser modulating system designated generally by the numeral 10 which is constructed in accordance with the principals of the present invention. The system includes a base plate 12 on which is mounted a suitable heat sink 14 and on which is directly mounted an injection laser chip 16.

The laser chip 16 is preferably of the type such as GaAs, GaAlAs, and GaAsP. These materials provide a spectral output in the range of 0.61 to 1.6 micrometer. These also have the ability to be lased at room temperature without requiring cooling.

The laser chip is prepared in the usual manner having a front facet 18 and a rear facet 20 and a laser light channel 22 extending the length thereof. A bias current lead 24 is connected to the top surface thereof for applying a bias current from a suitable DC current source.

In the illustrated embodiment, the laser chip 16 is on the order of approximately 0.3 millimeters in length and is spaced approximately 0.5 millimeters from the face of an electro-optic crystal 26 such as a lithium niobate crystal, which has a length on the order of approximately 1.5 millimeters and is mounted on a heat sink, such as a metal block 28 mounted directly on the base member 12. Disposed directly behind the crystal 26 is a special mirror (such as a spherical mirror) 30 which is selected to reflect the electromagentic waves generated by the laser and has a spherically ground face 32. This mirror 30 is mounted so that it can be adjusted toward and away from the crystal 26 and rear facet of the laser chip 16. A bias contact 34 is secured to the top of crystal 26 and to a source of bias voltage or modulating voltage.

Figure 5:
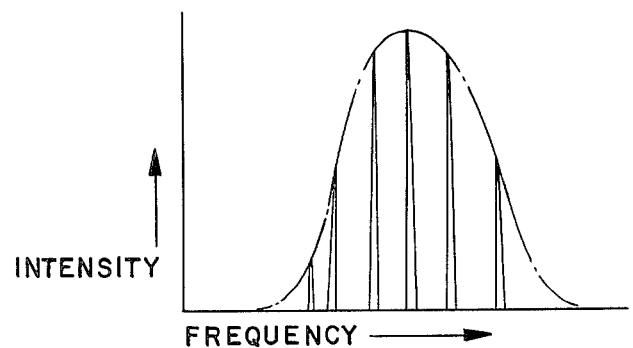
FIG. 5 is a graphic illustration of a typical spectral output of an injection laser.

The crystal 26 and mirror 30 act as an external resonator for the laser 16 with the energy from the rear facet of the laser passing through the crystal and reflected back from the mirror surface 32 and fed back into the laser 16. The reflections provided by the mirror 30 and the medium in form of the crystal 26 influence the laser's oscillation behavior. Without the mirror and crystal the laser emits its infrared (IR) energy, either in one or several longitudinal modes, such as shown in FIG. 5.

The mirror and crystal by virtue of its adjustment ability allows one to control the mode power by adjustments in the resonator. The bias voltage or modulating voltage on the crystal modifies the optical properties (changes optical path length) of the material and thereby provides a tunable resonator system. By virtue of this tunable system, the laser can be modulated (i.e. shifted) at very high frequencies between adjacent modes as shown in FIGS. 3 and 4.

Figure 4:
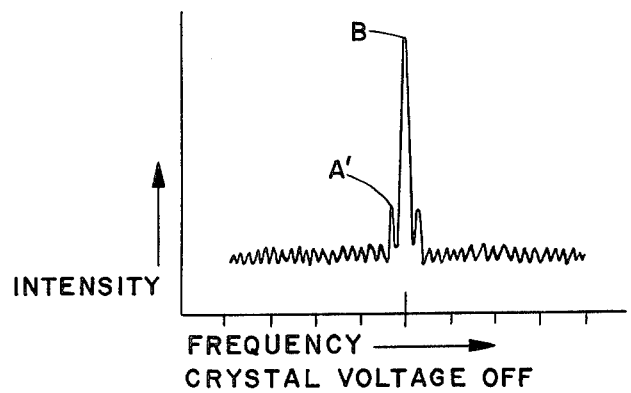
FIG. 4 is a graphic illustration like FIG. 3 of a second condition of operation.

The peak A of the curve in FIG. 3 shows the intensity and frequency with the crystal voltage applied at approximately 750 volts for a crystal height of 1.2 mm. Reducing the crystal height results in a proportional reduction in the required voltage. FIG. 4, which has been aligned directly below FIG. 3 for ease of comparison, shows the laser intensity versus frequency of the external laser cavity modulator with the crystal bias voltage equal to zero. The amplitude peak B of the curve in FIG. 4 shows the laser has shifted its output in frequency to the right of the peak A in FIG. 3. This corresponds to a shift from the frequency represented by peaks or spike A, A' to the frequency represented by peaks or spikes B, B'. The A and B peaks represent the maximum energy output at the frequency or mode and the peaks A' and B' represent the minimum or suppressed output at the respective modes. Thus, a high frequency application of a modulating voltage to the crystal results in a shift back and forth between the modes. This demonstrates a clear mode switching (frequency switching, approximately 120 Gigahertz) by electronic means without the application or altering of the laser bias voltage.

This arrangement provides a much higher frequency modulation capability than the typical modulation by means of the laser bias current because only photons are involved. Such techniques as herein described have been successfully tested and used to build and operate high speed external laser modulators which have reached modulation frequencies of 18 gigahertz during tests. This concept provides modulation capability at very high frequencies with applications for communication-type systems.

The present system provides a means wherein multilongitudinal mode lasers can be modified such that certain modes can be attenuated, and in a single longitudinal mode laser, one can shift the output from one mode to an adjacent mode. This action results from the standing wave field pattern created by the external FP-Resonator which is superimposed upon the lasers electromagnetic field pattern. The variable medium between the mirror and laser facet, i.e. electro-optic crystal, permits electronically controlled medium and a "modestructure" modulator is obtained. The potential speed of such a modulator is very fast since only photons are involved and no laser current has (electronics) to be modulated.

The external resonator of the present invention functions to change the "natural" selected mode of the laser by the additional standing wave field pattern created by the back mirror. The laser reacts to this condition and emits in an adjacent longitudinal mode.

Other constructions are possible for achieving the electronically adjustable resonator such as placing a second laser chip in close proximity to the first laser chip or any other transparent electro-optic device. Modulating the second chip would render a practical form of such a high speed modestructure modulator.

The laser can also be shifted between adjacent modes by movement of the mirror 30 above. This would require high speed means for shifting it to the required positions.

While I have illustrated and described my invention by means of specific embodiment, it is to be understood that numerous changes and modifications may be made therein without departing from the scope of the invention as defined by the appended claims.

I claim:

1. A high frequency modulating system for a laser comprising:
   a laser,
   bias means for said laser, and
   an external tunable resonator comprising an electro-optic device optically coupled to said laser for selective shifting of said laser between modes.

2. The laser system of claim 1 wherein said laser is an injection laser.

3. The system of claim 1 wherein said electro-optic device is an electro-optic crystal.

4. The system of claim 3 wherein said laser includes a rear facet, and said resonator means comprises a mirror positioned in close proximity to and aligned with the rear facet of said laser, and said electro-optic crystal is disposed between said mirror and said laser.

5. The system of claim 4 wherein said mirror is a spherical mirror.

6. The system of claim 5 wherein said mirror is moveable toward and away from said laser.

7. The system of claim 3 wherein said elector-optic crystal is a lithium niobate crystal.

8. A high frequency laser modulating system, comprising:
   a laser,
   bias means for said laser, and
   an external tunable resonator optically coupled to said laser for selectively changing the natural selected modes of said laser:
   wherein said laser is a GaAlAs chip having front and rear facets and mounted on a support member,
   a source of bias current for said laser chip, and
   said resonator comprises a spherical mirror disposed in close proximity to the rear facet of said laser and aligned therewith, said mirror mounted for movement toward and away from said laser chip, an electro-optic crystal disposed between said laser and said mirror, and a source of modulation voltage connected for application to said electro-optic crystal.

9. The system of claim 8 wherein said electro-optic crystal is a lithium niobate crystal.

10. A high frequency modulating system for a laser, comprising:
    an injection laser,
    bias means for said laser, and
    an external tunable resonator comprising an electro-optic device optically coupled to said laser for selective high frequency shifting between the natural modes of said laser.

11. The system of claim 10 wherein said electro-optic device is an electro-optic crystal.

12. The system of claim 11 wherein said laser includes a rear facet, and said resonator means comprises a mirror positioned in close proximity to and aligned with the rear facet of said laser, and said electro-optic crystal is disposed between said mirror and said laser.

13. The system of claim 12 wherein said mirror is a spherical mirror.

14. The system of claim 13 wherein said mirror is movable toward and away from said laser.

15. The system of claim 13 wherein said electro-optic crystal is a lithium niobate crystal.

16. A high frequency modulating system for a laser comprising:
    a laser comprising a chip having front and rear facets and mounted on a support member,
    a source of bias current for said laser chip, and
    a resonator comprising a spherical mirror disposed in close proximity to the rear facet of said laser and aligned therewith, said mirror mounted for movement toward and away from said laser chip, and electro-optic crystal disposed between said laser and said mirror, and a source of modulation voltage connected for application to said electro-optic crystal.

17. The system of claim 16 wherein said electro-optic crystal is a lithium niobate crystal.

* * * * *

UNITED STATES PATENT AND TRADEMARK OFFICE
CERTIFICATE OF CORRECTION

PATENT NO. : 4,485,474
DATED : November 27, 1984
INVENTOR(S) : JOHANN M. OSTERWALDER It is certified that error appears in the above-identified patent and that said Letters Patent are hereby corrected as shown below:

Column 4, line 5, after the word "said", change "elector-optic" to --electro-optic--.

Signed and Sealed this

Twenty-first Day of May 1985

[SEAL]

Attest:

DONALD J. QUIGG

Attesting Officer

Acting Commissioner of Patents and Trademarks